United States Patent [19]

Tanaka et al.

[11] Patent Number: 4,532,818
[45] Date of Patent: Aug. 6, 1985

[54] CLUTCH INTERLOCKING MECHANISM

[75] Inventors: Yoshio Tanaka; Yasuhisa Nishikawa; Ryoichi Hasumi, all of Saitama; Takashi Koizumi, Toda, all of Japan

[73] Assignee: Clarion Co., Ltd., Tokyo, Japan

[21] Appl. No.: 191,267

[22] Filed: Sep. 26, 1980

[30] Foreign Application Priority Data

Sep. 27, 1979 [JP] Japan .................. 54-132567[U]

[51] Int. Cl.³ .................. H03J 5/12; G05G 1/02
[52] U.S. Cl. .................. 74/10.33; 74/10.8; 74/409; 334/7
[58] Field of Search .................. 74/10.27, 10.33, 10.37, 74/10.8, 409; 334/7

[56] References Cited

U.S. PATENT DOCUMENTS 4,020,704  5/1977  Miyagi ..................... 74/10.33
4,118,992 10/1978  Yamagishi ................ 74/10.33
4,262,547  4/1981  Kanai ..................... 74/10.33

Primary Examiner—Allan D. Herrmann
Attorney, Agent, or Firm—Wallenstein, Wagner, Hattis, Strampel & Aubel

[57] ABSTRACT

A clutch interlocking mechanism for use in a pushbutton tuner wherein a drive gear provided on a clutch mechanism is meshed with a rack of a memory slide, a support bracket, on which the clutch mechanism is mounted, is supported, at one side thereof, by a frame on a chassis through a fulcrum pin and, at the opposite side thereof, provided with a tension spring to assure positive engagement of the drive gear with the rack. The clutch interlocking mechanism further comprises a resilient member provided for the fulcrum pin to eliminate looseness at the portion of the fulcrum pin.

4 Claims, 5 Drawing Figures

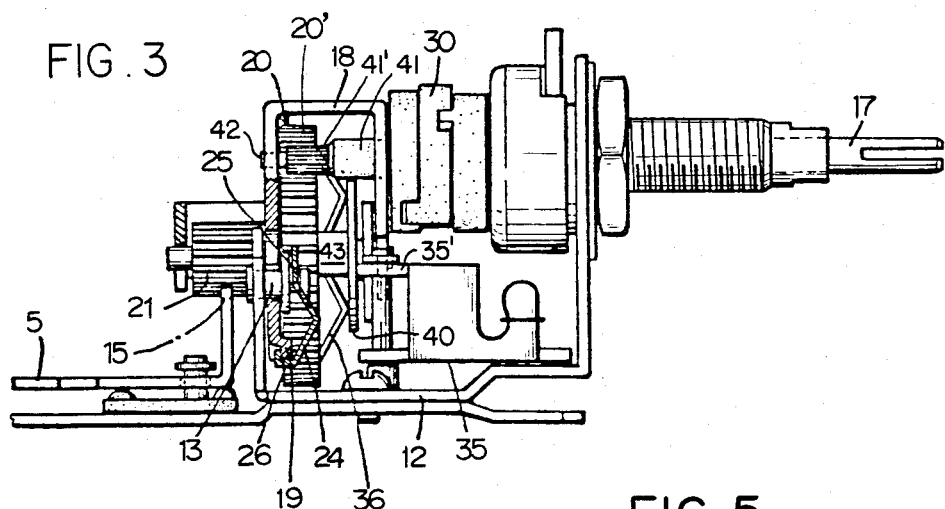
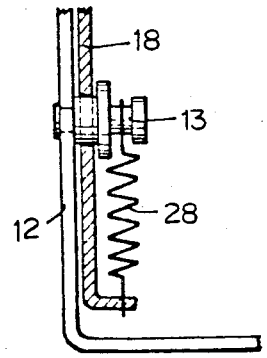
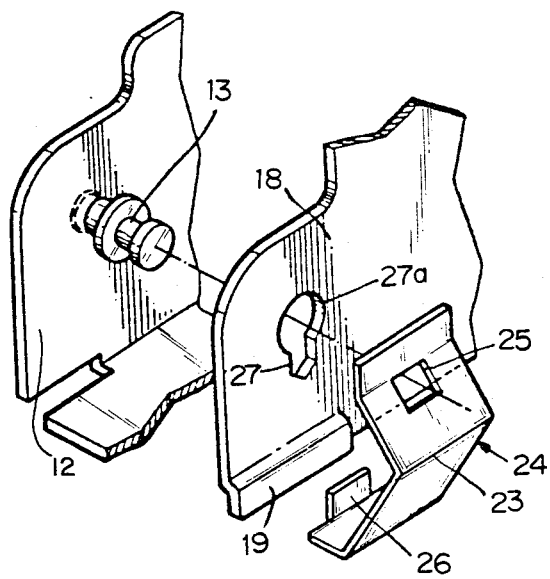

4,532,818

CLUTCH INTERLOCKING MECHANISM

BACKGROUND OF THE INVENTION

1. Field of the Invention

This invention relates to a clutch interlocking mechanism for use in a pushbutton tuner, and more particularly to a clutch interlocking mechanism incorporated between a manual rotary tuning system and pushbutton tuning system of a pushbutton tuner which is capable of eliminating play and backlash between a gear and a rack of the clutch interlocking mechanism.

2. Description of the Prior Art

In general, a pushbutton tuner is provided with a clutch mechanism between a tuning system by a manual rotary shaft and a tuning system by a pushbutton tuner for switching of the systems. In a conventional pushbutton tuner, a memory slide is displaced through such a clutch mechanism and a drive gear provided on the clutch mechanism is urged to be meshed with a rack of the memory slide by a spring pressing the drive gear against the rack. However, urging or pressing by the spring will not always result in a desired effect but sometimes will cause lifting of a fulcrum portion or produce undesired play or backlash in the engagement of the gear. Thus, desired tuning cannot always be expected due to the so caused backlask etc.

OBJECT OF THE INVENTION

It is therefore an object of the present invention to provide a clutch interlocking mechanism for use in a pushbutton tuner which is capable of eliminating backlash between a gear and a rack of the clutch interlocking mechanism.

SUMMARY OF THE INVENTION

In accordance with the present invention, there is provided a clutch interlocking mechanism for use in a pushbutton tuner including a plurality of button slides, a memory slide, a kick arm, and tuning coils and cores, wherein the memory slide and the kick arm are displaced upon depression of any of the button slides and the degree of insertion of the cores into the coils varies in response to the displacement of the memory slide. The invention comprises:
- a frame provided on a chassis of the pushbutton tuner;
- a fulcrum (i.e. pivot) pin provided on said frame;
- a support bracket supported by the fulcrum pin;
- a clutch mechanism supported by said support bracket;
- a manual rotary tuning shaft;
- a means for changing over engagement between said manual rotary tuning shaft and said clutch mechanism in response to the displacement of the kick arm;
- said clutch mechanism including a drive gear which is in mesh with a rack formed on said memory slide;
- a means resiliently connecting said fulcrum pin and said support bracket for eliminating looseness at a portion of the fulcrum pin.

BRIEF DESCRIPTION OF THE DRAWINGS

FIG. 3 is a partly cut-away side elevational view of the clutch mechanism illustrated in FIG. 2, taken along a depth thereof;

FIG. 4 is a fragmentary perspective view of a part of the clutch mechanism, illustrating a fulcrum pin and a support bracket; and FIG. 5 is a sectional view of another form of clutch interlocking mechanism in accordance with the present invention, taken along the depth thereof.

DESCRIPTION OF THE EMBODIMENT

Figure 1:
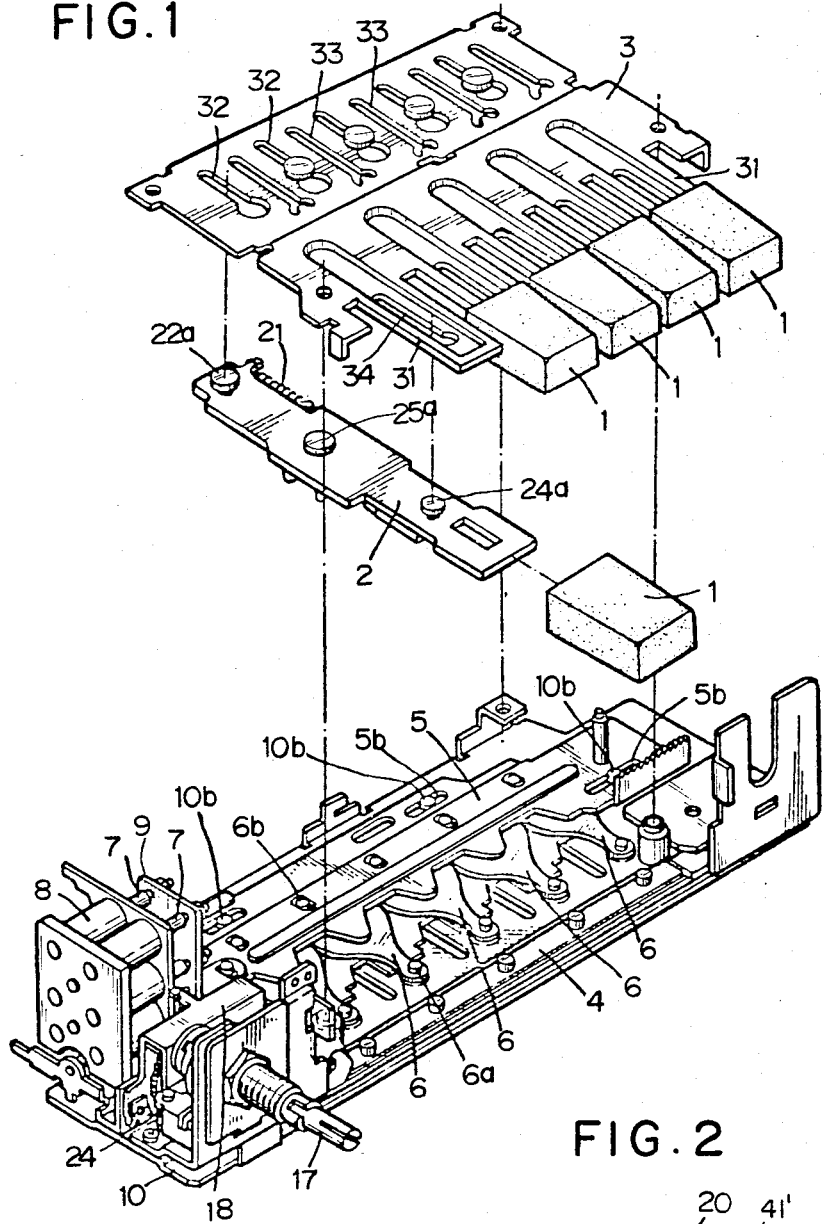
FIG. 1 is an exploded perspective view of a pushbutton tuner which employs one form of clutch interlocking mechanism in accordance with the present invention.

Referring now to the drawings, there is illustrated a clutch interlocking mechanism for use in a pushbutton tuner in accordance with the present invention. A general structure of the pushbutton tuner is as illustrated in FIG. 1, wherein a plurality of button slides 2 each having push buttons 1 respectively are arranged in a row over a chassis 10 and a top plate 3 is provided to cover an area where the button slides 2 are arranged. When any of the push buttons 1 is depressed along a guide 31 formed at a forward end of the top plate 3, guide pins 22a and 24a provided on the button slide 2 are engaged with and guided by guide slots 32 and 34 of the top plate, respectively. A spring 21 provided at a side of the button slides 2 is accommodated in a spring receiving slot 33 of the top plate 3 which is biased to reset the button slide 2 forwardly when the slide 2 is depressed backwardly.

Figure 2:
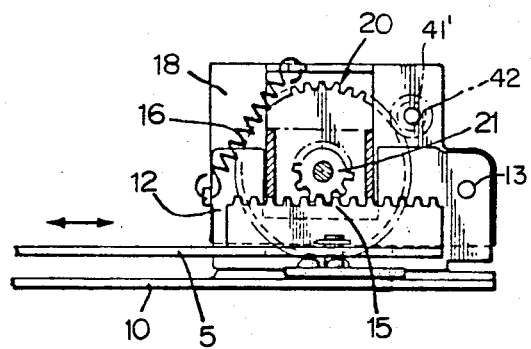
FIG. 2 is a side elevational view of a clutch mechanism of the pushbutton tuner illustrated in FIG. 1, taken along a width thereof.

A kick arm 4 is provided on the chassis 10 so as to be slidable laterally and link members 6, 6 . . . are connected, at their respective forward ends, to the chassis 10 by respective pins 6a. An engaging pin 6b provided at a rearward end portion of each of the link members 6 is engaged with an elongated slot of the memory slide 5 which extends along the depth of the pushbutton tuner, while pins 10b provided on the chassis 10 are engaged with laterally extending slots 5b formed on the memory slide 5 at its rear side portions. Upon depression of the button slide 2, a setting pin 25a provided thereon acts on a side edge of either of the link members 6 located adjacent to that button slide 2 and the memory slide 5 is displaced along the laterally extending slots 5b. Cores 7 are provided on a seat 9 formed by bending one side end portion of the memory slide 5 and the coils provided on the chassis 10 are inserted into the respective coils. Therefore, the amount of insertion of the cores 7 into the coils 8 are varied according to displacement of the memory slide 5, so that desired tuning can be attained by one manual operation of the push button. The memory slide 5 further has a rack portion 15 which is in mesh with a drive gear 21 of a clutch mechanism 20 provided at a side portion of the chassis 10 as illustrated in FIGS. 2 and 3. Within a support bracket 18' having a U-like configuration as shown in FIGS. 1 and 3, the main part of the clutch mechanism 20 namely a gear member 20', resilient member 24, resilient plate 36, plate 40 and gear 41' formed on an axis 41 of the universal joint 30 are supported by shafts 42 and 43 as shown in these drawings. Said support bracket 18 of the clutch mechanism 20 is supported, at its slot 27 having an enlarged portion 27a, by a support pin, or fulcrum pin 13 provided on a frame 12 disposed on the chassis 10 as illustrated in FIG. 4. The support pin 13 is also engaged with a resilient member 24 having a bent or crooked portion 23 formed at an intermediate portion thereof through an engaging slot 25 formed at an upper portion thereof. The resilient member 24 has a hook 26 at a lower portion thereof and the hook 26 is engaged with a step 19 formed at a lower end of the support bracket 18. By the engagement between the step 19 and the hook 26 and the engagement between the slot 25 and a head of the support pin 13, a resiliently pressing force is applied to the support pin 13 to eliminate a looseness or undesired play in the supporting portion. Furthermore, between the support bracket 18 of the clutch mechanism 20 and the frame 12, there is provided a tension spring 16 on a side opposite to the support pin 13 with respect to the meshing position between the drive gear 21 and the rack 15 to assure positive engagement between the gear 21 and the rack 15.

The clutch mechanism 20 has a conventional structure. In the clutch mechanism 20, while the pushbutton 1 is not operated, the clutch lever 35 is coupled, at the top end 35' thereof, with the plate 40 as shown in FIG. 3. The resilient plate 36 is pressed to the gear member 20' by the plate 40 to adequately bring the gear member 20' into meshing engagement with the gear 41. Therefore, by operating the manual rotary tuning shaft 17, the gear member 20' and the drive gear 21 are driven to shift the memory slide 5. Thus, the manual tuning operation is performed.

In accordance with the present invention, a tension spring 28 may be employed in place of the resilient member 24 as illustrated in FIG. 5. The tension spring 28 is provided between the support pin 13 and a lower end of the support bracket 18.

In accordance with the present invention as described above, the support bracket 18 of the clutch mechanism 20, which is fixed on one side thereof by the fulcrum pin 13, is subjected to a tension force by the spring 16 oppositely provided with respect to the drive gear 21 so as to assure positive engagement between the drive gear 21 and the rack 15 of the memory slide 5. Furthermore, since the resilient member 24 or the spring 28 is provided for the fulcrum pin 13 to eliminate looseness in the portion of the fulcrum pin 13, there can be established positive engagement without backlash or play thereby to enable stable tuning without tuning deflection due to backlash etc. In addition, tuning operations by the manual rotary shaft tuning shaft 17 and the push button 1 can be attained easily and accurately.

We claim:

1. In a pushbutton tuner having a plurality of manually operable tuning button slides, a memory slide coupled to said button slides to be moved a distance which varies according to the button slide selected for actuation, tuning means coupled to said memory slide for varying the tuning frequency of said tuner responsively to the displacement of said memory slide to effect a station tuning operation, a geartooth rack affixed to said memory slide, an output drive gear engaging said memory slide rack, a manually rotatable tuning shaft, rotary drive means coupling said drive gear to said tuning shaft, said rotary drive means including clutch means actuated by operation of any button slide from a normally engaged position which couples said tuning shaft to said drive gear to a disengaged position, the improvement comprising:

a support element;

a pivot pin rigidly affixed to said support element;

a support bracket carrying at least a portion of said rotary drive means, said portion including said drive gear and said clutch means, said support bracket having a hole therein for accepting passage of said pivot pin therethrough which pivotally supports said bracket, so that rotation of said support bracket in a first direction forces said drive gear into meshing engagement with said memory slide rack, said tuner further including resilient spring means connected between said support bracket and said support element for urging said support bracket in said first direction so as to keep said rack and said drive gear in meshing engagement; and means for resiliently tensioning said support bracket against said pivot pin to force a portion of the wall defining said bracket hole against a portion of said pivot pin so as to eliminate looseness between said support bracket and said pivot pin.

2. The apparatus of claim 1, wherein said portion of said pivot pin contacting said portion of said wall defining said hole is cylindrical, said portion of said wall is configured as a V-shaped extension of said hole, and said means for resiliently tensioning said support bracket against said pin directs said tension substantially along the axis of said extension, so that said support bracket and said pin are in two-point engagement without looseness therebetween.

3. The apparatus of claim 1, wherein said means resiliently tensioning said pivot pin to said support bracket is a resilient member, said resilient member having at an end portion thereof a slot with which said pivot pin is engaged, and having at an intermediate portion thereof a crooked portion, and having at an opposite end portion thereof a hook which is engaged with a portion of said support bracket.

4. The apparatus of claim 1, wherein said means for resiliently tensioning said pivot to said support bracket is a spring tensioned therebetween.

* * * * *